United States Patent [19]

Dearnaley et al.

[11] Patent Number: 6,087,025
[45] Date of Patent: Jul. 11, 2000

[54] APPLICATION OF DIAMOND-LIKE CARBON COATINGS TO CUTTING SURFACES OF METAL CUTTING TOOLS

[75] Inventors: Geoffrey Dearnaley; James Lankford, Jr.; James H. Arps, all of San Antonio, Tex.

[73] Assignee: Southwest Research Institute, San Antonio, Tex.

[21] Appl. No.: 08/946,314

[22] Filed: Oct. 7, 1997

Related U.S. Application Data

[63] Continuation-in-part of application No. 08/630,141, Apr. 10, 1996, Pat. No. 5,725,573, which is a continuation-in-part of application No. 08/220,234, Mar. 29, 1994, Pat. No. 5,593,719, and a continuation-in-part of application No. 08/592,077, Jan. 26, 1996, Pat. No. 5,731,045.

[51] Int. Cl.$^7$ .......................... B32B 15/00; B32B 15/04; B32B 7/02

[52] U.S. Cl. .................. 428/623; 428/627; 428/213; 428/628; 428/698; 428/634; 51/295

[58] Field of Search ................... 428/627, 628, 428/634, 641, 615, 678, 241, 450, 689, 697, 698, 699, 213, 623; 51/295; 73/DIG. 12; 175/434

[56] References Cited

U.S. PATENT DOCUMENTS

| | | | |
|---|---|---|---|
| 3,622,440 | 11/1971 | Snedeker et al. | 161/193 |
| 3,707,006 | 12/1972 | Bokros et al. | 3/1 |
| 3,717,522 | 2/1973 | Shirato et al. | 156/53 |
| 4,362,681 | 12/1982 | Spector et al. | 264/112 |
| 4,410,611 | 10/1983 | MacIver | 430/5 |
| 4,452,827 | 6/1984 | Kolev et al. | 427/38 |
| 4,465,715 | 8/1984 | Manabe et al. | 427/444 |
| 4,486,286 | 12/1984 | Lewin et al. | 204/192 C |
| 4,495,044 | 1/1985 | Banks | 204/192 C |
| 4,554,208 | 11/1985 | MacIver et al. | 428/332 |
| 4,647,494 | 3/1987 | Meyerson et al. | 428/216 |
| 4,698,236 | 10/1987 | Kellogg et al. | 427/43.1 |
| 4,725,345 | 2/1988 | Sakamoto et al. | 204/192.31 |
| 4,743,493 | 5/1988 | Sioshansi et al. | 428/217 |
| 4,746,538 | 5/1988 | Mackowski | 427/38 |
| 4,756,964 | 7/1988 | Kincaid et al. | 428/408 |
| 4,770,902 | 9/1988 | Barlow et al. | 427/117 |
| 4,772,513 | 9/1988 | Sakamoto et al. | 428/408 |
| 4,778,469 | 10/1988 | Lin et al. | 623/16 |
| 4,822,355 | 4/1989 | Bhuvaneshwar | 623/2 |
| 4,822,466 | 4/1989 | Rabalais et al. | 204/192.15 |
| 4,877,677 | 10/1989 | Hirochi et al. | 428/216 |
| 4,966,803 | 10/1990 | Pluyter et al. | 428/192 |
| 4,981,071 | 1/1991 | Enke | 92/261 |
| 4,988,421 | 1/1991 | Drawl et al. | 204/192.3 |
| 4,992,153 | 2/1991 | Bergmann et al. | 204/192.16 |
| 4,992,298 | 2/1991 | Deutchman et al. | 427/38 |
| 5,009,923 | 4/1991 | Ogata et al. | 427/38 |
| 5,028,451 | 7/1991 | Ito et al. | 427/39 |
| 5,064,682 | 11/1991 | Kiyama et al. | 427/38 |
| 5,084,151 | 1/1992 | Vallana et al. | 204/192.11 |
| 5,130,161 | 7/1992 | Mansur et al. | 427/38 |
| 5,133,757 | 7/1992 | Sioshansi et al. | 623/18 |
| 5,133,845 | 7/1992 | Vallana et al. | 204/192.15 |
| 5,135,808 | 8/1992 | Kimock et al. | 428/336 |
| 5,169,597 | 12/1992 | Davidson et al. | 428/613 |
| 5,176,710 | 1/1993 | Hahn et al. | 623/20 |
| 5,192,330 | 3/1993 | Chang et al. | 623/22 |
| 5,192,523 | 3/1993 | Wu et al. | 427/523 |
| 5,219,363 | 6/1993 | Crowninshield et al. | 623/23 |
| 5,223,045 | 6/1993 | Priceman | 148/268 |
| 5,232,568 | 8/1993 | Parent et al. | 204/192.3 |
| 5,246,884 | 9/1993 | Jaso et al. | 437/225 |
| 5,249,554 | 10/1993 | Tamor et al. | 123/90.51 |
| 5,252,174 | 10/1993 | Deguchi et al. | 156/612 |
| 5,270,252 | 12/1993 | Papanicolaou | 437/176 |
| 5,314,492 | 5/1994 | Hamilton et al. | 623/23 |
| 5,391,407 | 2/1995 | Dearnaley | 427/527 |
| 5,415,704 | 5/1995 | Davidson | 148/316 |
| 5,425,777 | 6/1995 | Sarkisian et al. | 623/21 |
| 5,645,900 | 7/1997 | Ong et al. | 427/571 |

FOREIGN PATENT DOCUMENTS 63-199870  8/1988  Japan .

OTHER PUBLICATIONS

"Diamond Coating May Be Future Of Tool Manufacture", Malcolm W. Browne, San Antonio Express–News, Apr. 1, 1996.

"Adherence Of Diamondlike Carbon Coatings On Total Joint Substrate Materials", J. Lankford, et al., Nuclear Instruments and Methods in Physics Research B80/81 (1993) 1441–1445 North–Holland (No Month).

"The Clinical Significance Of Wear In Total Hip And Knee Prostheses", John H. Dumbleton, Ph. D., Journal of Biomaterials Applications vol. 3—Jul. 1988 pp. 3–32.

"Bioapplications Of Diamond–Like Carbon Coatings", G. Dearnaley, et al., $4^{th}$ World Biomaterials Congress, Berlin, Apr. 1992.

"Stress And Microstructure Of Diamond–Like Carbon From Ion–Beam Decomposition Of Hydrocarbon Precursors", A. M. Jones, et al. $2^{nd}$ European Conference on Diamond–Like And Related Coatings, Nice, France, 2–6/9/91 (Sep. 1991).

"Diamond–Like Carbon From The Ion–Beam Decomposition Of Polyphenyl Ether", C. J. Bedell, et al., Applications of Diamond Films & Related Materials, 833–838 (1991) Elsevier (No Month).

"Surface Modification Issues For Orthopaedic Implant Bearing Surfaces", J. A. Davidson, et al, Surface Modification Technologies V, The Institute of Materials, 1992 (No Month).

(List continued on next page.)

*Primary Examiner*—John J. Zimmerman
*Assistant Examiner*—Michael LaVilla
*Attorney, Agent, or Firm*—Paula D. Morris & Associates, P.C.

[57] ABSTRACT

The present invention provides metal working tools with metal working surfaces bearing a coating of diamond-like carbon that is strongly adhered to the surface via the following gradient: metal alloy or cobalt-cemented tungsten carbide base; cobalt or metal-silicide and/or cobalt or metal-germanide; silicon and/or germanium; silicon carbide and/or germanium carbide; and, diamond-like carbon.

16 Claims, No Drawings

OTHER PUBLICATIONS

"Materials Science Aspects Of Ion Beam Technology", G. Dearnaley, Surface Engineering, 1991, vol. 7, No. 2, pp. 127–136 (No Month).

"Surface Treatment Of Ultra High Molecular Weight Polyethylene To Enhance Adhesion And Conductivity Properties", P. Gao, et al., Polymer, 1992, vol. 33, No. 19 (No Month).

"Diamond–Like Carbon Applied to Bioengineering Materials", A. C. Evans, et al., Medical Device Technology, May 1991, pp. 26–29.

"The Effects Of Diamond–Like–Carbon Coatings On The Friction And Wear Of Enhanced Uhmwpe–Metal Couples", C. M. Agrawal, et al., 19$^{th}$ Annual Meeting of the Society for Biomaterials, Apr. 28–May 2, 1993, Birmingham, AL,USA.

"Improvement Of Thermally Formed Nickel Silicide By Ion Irradiation", L. S. Wielunski, et al., Science Technology, vol. 20, No. 2, Feb. 1982.

APPLICATION OF DIAMOND-LIKE CARBON COATINGS TO CUTTING SURFACES OF METAL CUTTING TOOLS

The present application is a continuation-in-part of application Ser. No. 08/630,141 filed Apr. 10, 1996, now U.S. Pat. No. 5,725,573 which is a continuation-in-part of application Ser. No. 08/220,234, filed Mar. 29, 1994 and issued Jan. 14, 1997 as U.S. Pat. No. 5,593,719. The present application also is a continuation-in-part of application Ser. No. 08/592,077, filed Jan. 26, 1996 now U.S. Pat. No. 5,731,045.

FIELD OF THE INVENTION

The present invention provides a process for firmly adhering a diamond-like carbon coating to metal working tools made either of a metal alloy, such as high speed steel, or of cobalt-cemented tungsten carbide.

BACKGROUND OF THE INVENTION

Cobalt-cemented tungsten carbide is a composite material that is widely used to make metal working tools, particularly metal cutting tools. Other metal working tools, such as milling cutters, reamers, drillers, etc., are made of metal alloys such as high speed steel.

One disadvantage of cobalt-cemented tungsten carbide is that it has a relatively soft matrix of binder phase material. Many have attempted to harden the surface of cobalt cemented tungsten carbide tools by coating the working surfaces with a protective layer of harder material, such as diamond or amorphous diamond-like carbon (DLC). Unfortunately, DLC coatings do not adhere well to cobalt-cemented tungsten carbide.

One reason for the poor adherence of DLC to cobalt-cemented tungsten carbide is the fact that cobalt comprises between about 5–15%—typically about 6%—of the composite. The cobalt acts as an adhesive to wet the carbide grains. The cobalt also has a catalytic effect upon the formation of graphite—a weak material. As a result, a preponderance of graphite and weak $sp^2$ bonds are formed in the coating instead of strong, three-dimensionally bonded "diamond-like" carbon.

Researchers have attempted to prevent the formation of graphite instead of DLC by removing cobalt from the surface of cobalt-cemented tungsten carbide using acid etching, plasma etching, and other methods. Unfortunately, etching reduces the necessary support for the carbide grains, leaving them susceptible to removal under stress. In an attempt to overcome this result, copper has been electroplated onto the substrate to fill voids left by the etching. Unfortunately, none of the methods currently used to promote adherence of DLC to cobalt-cemented tungsten-carbide components has been entirely successful.

DLC coatings also are difficult to adhere to the surfaces of metal alloy working tools made of high speed steel. Originally, DLC coatings were formed on metal alloys using chemical vapor deposition, which required that the workpiece or surface be subjected to a temperature of about 750° C. The only metal alloys that can be treated using such high temperatures are not strong in tension. Also, a continuous diamond-like carbon film has an exceptionally low coefficient of thermal expansion and an extremely high modulus of elasticity. No commercially available metal alloys could both tolerate the high temperatures required to form a diamond-like carbon coating using CVD, and provide sufficient mechanical support for a continuous diamond-like carbon coating, even under the significant internal stresses which develop during metal cutting and finishing.

The use of ion beam assisted deposition to deposit DLC coatings overcomes the need to use high temperatures during the deposition process. DLC that is deposited using ion beam assisted deposition has far lower residual stress than chemical vapor deposited DLC, and is a better candidate for a high integrity DLC. However, it is difficult to form a DLC coating which will adhere strongly enough to the surface of any metal working tool that the DLC will resist cracking, loss of adhesion, and ultimate spallation.

Some have suggested forming an intermediate "bond-coat" to more strongly adhere the DLC coating to the cutting surface. The substrate material to which all forms of carbon adhere most successfully is silicon. This is because strong covalent Si—C bonds are easily formed between the coating and the silicon substrate. Some have attempted to improve the adhesion of DLC to metal alloys by forming an interposed silicon bond-coat to which the DLC will adhere more strongly. Unfortunately, this simple approach does not result in adhesion that survives in applications where the DLC coating is subjected to substantial friction and stress. The simple formation of a silicon bond-coat on a metal alloy appears to create another relatively weak interface between the silicon and the metal alloy.

Methods are needed to produce metal working tools with cutting surfaces bearing DLC coatings that are bound to the surface strongly enough to resist cracking, loss of adhesion, and ultimate spallation.

SUMMARY OF THE INVENTION

The present invention provides a tool comprising a base material selected from the group consisting of cobalt-cemented tungsten carbide and a metal alloy, said tool comprising a metal working surface comprising the following sequential gradient: said base material; an intermetallic material comprising an element selected from the group consisting of silicon, germanium, and a combination thereof chemically bonded to metal in said base material, said metal consisting essentially of cobalt where said base material comprises cobalt-cemented tungsten carbide; an interlayer comprising said element selected from the group consisting of silicon, germanium, and a combination thereof cohesively bonded to said intermetallic material; carbon chemically bonded to said interlayer, forming a carbide selected from the group consisting of silicon carbide, germanium carbide, and a combination thereof; and, diamond-like carbon cohesively bonded to said carbide.

DETAILED DESCRIPTION OF THE INVENTION

The present invention uses ion beam assisted deposition of silicon or germanium, followed by ion beam assisted deposition of diamond-like carbon ("DLC") to form strong interatomic bonds across the DLC coating-substrate interface. In order to knit the successive layers of metal alloy or cobalt-(silicon or germanium)-DLC together effectively, it is necessary to supply a bond-interface for both the metal-silicon or metal-germanium bond and for the silicon-DLC or germanium-DLC bond. Without limiting the present invention, it is believed that the present method achieves this result by forming strong interatomic bonds having a character that is intermediate to the type of bonds between the atoms in the metal and the type of bonds between the atoms in the silicon or germanium interlayer. Although a combination of silicon and germanium can be used, it is preferred to use silicon or germanium, alone, because of the difference between the vaporization points of the two materials.

The present invention would work with pure metals as well as with metal alloys; however, as a practical matter, a metal must be alloyed in order to form a viable industrial component. The present invention may be used to form a DLC coating on a component made of substantially any metal alloy. A preferred metal alloy for metal working tools is high speed steel, which for cutting applications has a typical composition as follows: carbon, 0.75%; chromium, 4.0%; tungsten, 18.0%; vanadium, 1.5%, and cobalt, 5.0%.

Where the substrate is cobalt-cemented tungsten carbide, the invention provides a means to convert cobalt near the surface into a material to which DLC adheres strongly. Silicon is known to form a strong bond with DLC due to the formation of a thin film of silicon carbide, SiC, at the interface between the silicon and the DLC. Germanium also forms a strong bond with DLC by forming a thin film of germanium carbide (GeC) at the interface between the germanium and the DLC. The strong bond formed between silicon or germanium and carbon is due to the similarity in nature of covalent Si—C/Ge—C bonds to covalent Si—Si/Ge—Ge bonds, respectively, and to the covalent C—C bonds found in carbon.

In bonding a covalent material, such as carbon, to a metal, such as cobalt or a metal alloy, a graded series of materials should be formed having a progressive nature of interatomic bonding. The graded series of materials formed according to the present invention are, sequentially: (cobalt or metal alloy); (cobalt or metal)-silicide and/or (cobalt or metal) germanide); silicon and/or germanium; (silicon and/or germanium)-carbide, and, DLC. Metal-silicides, cobalt silicides (mono-silicide, CoSi, and di-silicide, $CoSi_2$), metal germanides, and cobalt germanides (mono-germanide, CoGe, and di-germanide, $CoGe_2$) have interatomic bonding that is intermetallic in nature—that is, intermediate between that of a metal and that of the covalent substance, silicon or germanium.

In order to practice the present invention, the following procedures are followed. After conventional cleaning of the component to remove superficial contaminants, such as grease, the component is placed in a vacuum chamber that has been evacuated to a base pressure sufficiently low to permit a DLC precursor material to condense onto the component surface. A preferred pressure is less than about $10^{-5}$ torr. The component then is bombarded with inert ions, preferably argon ions, at an energy range between about 10–100 keV, preferably about 10 keV. This ion bombardment provides an effective means to remove some of the remaining adsorbed atoms from the surface.

The component should be heated. If the component is made of a metal alloy, the component should be heated preferably to a temperature of about 300° C. (572° F.), or, if the material is temperature sensitive, to the highest temperature acceptable for that material. If the component is made of high speed steel, the component preferably is heated to about 400° C. (752° F.)—the highest temperature to which high speed steel may be heated before degradation or softening begins, and an excellent temperature at which to form metal silicide or metal germanide. If the component is made of cobalt-cemented tungsten carbide, then the component is able to withstand higher process temperatures than high speed steel without degradation. Therefore, the component should be heated to a temperature in the range of from about 400° C. (752° F.) to about 600° C. (1112° F.), preferably about 500° C. (932° F.). Silicon and/or germanium then should be deposited onto the component using known means. A preferred means is to position the workpiece directly over an electron-beam heated volatilization hearth which is heated to a preferred temperature of about 750° C. (1382° F.) for silicon, or in the range of from about 450° C. (842° F.) to about 550° C. (1022° F.) for germanium. The procedure should be continued until a preferred coating thickness of between about 100–200 nm has been achieved. The thickness of the coating may be monitored by standard methods, e.g., using the frequency change of a quartz crystal oscillator positioned to intercept part of the flux of coating atoms.

The component preferably should be simultaneously bombarded in a continuous or interrupted fashion with an energetic beam of ions, preferably nitrogen ions, at an energy in the range of from about 1 keV to about 100 keV, preferably from about 5 keV to about 30 keV, in order to form an intermetallic bonding layer of metal-silicide or metal-germanide at the metal-silicon/metal-germanium interface, respectively. Where the component is made of cobalt-cemented tungsten carbide, the temperature of the component during this treatment should be held in the range of from about 400° C. (752° F.) to about 600° C. (1112° F.), preferably at about 500° C. (932° F.), in order to facilitate the solid-state chemical reaction between cobalt and silicon and/or germanium.

Nitrogen ions are preferred for the ion beams of the present invention because nitrogen ions are believed to actually bond with the substrate/coating or interlayer. Inert ions, such as argon and/or helium ions, will not bond with the substrate/film. The use of inert ions could result in bubbling and/or a weaker coating. Although it has not been proven, it is believed that strong carbon-nitrogen bonds form in the DLC layer when the ions used to make the DLC are nitrogen ions. In any event, the use of a beam of nitrogen ions can result in DLC coatings that increase wear resistance and decrease friction up to 5–7 times more than DLC coatings formed using other types of ions. Although nitrogen ions are preferred, other suitable ions may be used, such as argon, silicon, methane, helium, or neon.

The ratio of ions in the beam per atoms of silicon, germanium, or DLC precursor at the substrate surface is defined as the "ion arrival ratio." The process should be carried out at an ion arrival ratio of about 1:10, or 1 ion per 10 atoms of silicon or germanium at the surface of the substrate. The treatment should be terminated at a stage in which the surface of the coating on the substrate is still silicon- or germanium-rich, or a substantial amount of the silicon or germanium has not been converted to metal-silicide or metal-germanide, respectively. For a coating having a preferred thickness in the range of from about 100 to about 200 nm, the duration of the desired treatment should be about 15 minutes.

Thereafter, the component should be cooled to permit the DLC precursor to condense onto the surface of the component. Generally, the component should be cooled to below about 100° C. (212° F.), preferably without removing the component from the vacuum chamber. A suitable DLC precursor should be vaporized and condensed onto the surface of the component. Suitable DLC precursor materials include carbon-based diffusion pump materials which have a low vapor pressure and which can be vaporized stably at room temperature. Examples of such materials include, but are not necessarily limited to: polyphenyl ether; elcosyl naphthalene; i-diamyl phthalate; i-diamyl sebacate; chlorinated hydrocarbons; n-dibutyl phthalate; n-dibutyl sebacate; 2-ethyl hexyl sebacate; 2-ethyl hexyl phthalate; di-2-ethyl-hexyl sebacate; tri-m-cresyl phosphate; tri-p-cresyl phosphate; dibenzyl sebacate; polydimethyl siloxane, pentaphenyl-trimethyl siloxane, and other silicon containing diffusion pump fluids. Preferred diffusion pump fluids include, but are not necessarily limited to, polyphenyl ether and elcosyl naphthalene. A most preferred hydrocarbon precursor is polyphenyl ether. Other suitable hydrocarbon precursors contain carbon and other constituent elements, such as oxygen, nitrogen, or fluorine.

The DLC precursor preferably should be vaporized using an electrically heated reservoir or other thermally assisted means, under conditions in which the precursor will condense onto the surface of the substrate. Preferably at the same time, the component should be bombarded or irradiated, either in a continuous or interrupted fashion, with a second energetic beam of ions. The ions in this second ion beam preferably should be the same species and have the same energy as the ions in the first ion beam. In a preferred embodiment, the ions are nitrogen ions at an energy of between about 1–100 keV, preferably between about 5–30 keV. Other suitable ions also may be used, including but not necessarily limited to, argon, silicon, methane, helium, or neon.

The function of this second ion bombardment step is to rupture at least about 80% of the carbon-hydrogen bonds in the. DLC precursor, resulting in the formation of a noncrystalline coating of amorphous carbon. The energy dissipated by the energetic ion bombardment during ion beam assisted deposition is in the form of inelastic electronic excitations equivalent to at least about 100 eV for each carbon atom within the deposited coating. This energy dissipation strongly enhances adhesion of the DLC coating by rupturing and subsequently reforming interatomic bonds across the interfaces. Persons of ordinary skill in the art will recognize how to achieve the correct linear energy of transfer in the ionizing process. The procedure should be continued until a preferred coating thickness of DLC between about 100 nm-10 microns is achieved.

The invention will be more clearly understood with reference to the following examples which are illustrative only and should not be construed as limiting the present invention. The ion beam facility used in the following Examples consisted of a 1.4 m×2 m diffusion pumped vacuum chamber capable of achieving base pressures of $10^{-7}$ mbar. The radiofrequency-driven ion source produced a 20 cm diameter beam of 1–10 keV ions, delivering a current of up to 100 mA from a number of source gases.

EXAMPLE 1

A cobalt-cemented tungsten carbide component was placed in a vacuum of about $10^{-5}$ torr and bombarded with argon ions at an energy of about 10 keV to remove any remaining adsorbed atoms from the surface. The component was heated to about 225° C. (437° F.). Silicon was evaporated from a hearth by electron beam heating to about 750° C. (1382° F.) and deposited onto the component at a rate of about 0.15 nm/sec to a thickness of about 150 nm. Substantially simultaneously, the component was bombarded with nitrogen ions ($N_2+$) at an energy of about 9 keV and an ion to silicon atom ratio, or ion arrival ratio, of about 1:10. While still under vacuum, the component was cooled to 100° C. (212° F.), and polyphenyl ether was deposited onto the component to a thickness of about 1 μm. The component simultaneously was bombarded with nitrogen ions ($N_2+$) at an energy of about 9 keV and an ion arrival ratio, or ion to precursor atom ratio, of about 1:10 to form a DLC coating.

The sample was removed and subjected to a scratch test to assess the adhesion of the DLC coating. A 0.2 mm radius diamond indenter was applied with a force which increased linearly from 1–20 Newtons. No delamination of the DLC coating was observed by optical microscopy. As a further check, the scratched sample was studied by monitoring the flux of backscattered electrons from a scanning electron microscope. No difference in scattered intensity between the scratched and unaffected areas was observed, indicating that none of the underlying tungsten was exposed by the scratching. The scratch tests further revealed that the coefficient of friction of the DLC coated sample was reduced by more than a factor of 3 compared to an uncoated sample.

EXAMPLE 2

The procedures of example 1 are repeated using germanium in place of silicon. Similar results are observed.

EXAMPLE 3

Chrome and steel components of a combustion engine were coated with DLC with and without the bonding gradient of the present invention. In forming the bonding gradient, substrates were heated to 250° C. before high purity silicon was evaporated from a 40 $cm^3$ electron-beam heated hearth to an accumulated thickness of approximately 150 nm. A beam of 9 keV $N_2^+$ ions was used to aid the deposition with an approximate arrival ratio of 10 atoms per incident ion.

For DLC coating, polyphenyl ether (Santovac 5) and trimethyl trisiloxane (Dow-Corning 705) precursors were vaporized from a temperature-controlled resistively heated reservoir and decomposed using a 9 keV $N_2^+$ ion beam. Typical thicknesses of approximately 1 μm were accumulated in 1–2 h at an estimated deposition ratio of 3 C atoms per incident ion. A number of metal pins were coated with and without forming the silicon bonding gradient from both types of DLC precursors for the first phase of wear testing. The samples, 6.35 mm in diameter with a 25 mm radius of curvature, were fabricated from hardened 52100 steel (63 HRC) and polished to a 0.1 μm surface finish.

A modified reciprocating pin-on-flat wear test rig was used to evaluate the coated and uncoated surfaces under simulated operating conditions. Samples were drawn against cast iron flats at a velocity of 10 $cm/s^{-1}$ at an ambient temperature of 120° C. for 7–8 h. Based on estimates of the expected engine loads, 1 and 10 N forces were applied to the pins and ring segments respectively. Standard engine oil was applied to the surface of the flat at the start of each test and was not replenished during the run. The tangential force exerted on each pin was monitored using a calibrated eddy current transducer and a data acquisition system operating at a sampling interval of 500 μs. From the tangential force and applied normal force, the coefficient of friction was determined. The results indicated that the sampling rate was sufficient to detect both the dynamic and static friction coefficients.

The samples were removed from the wear test rig and examined for evidence of wear under an optical microscope. Optical micrographs of the wear scars formed on an uncoated pin and DLC-coated pin without a silicon bonding gradient revealed that the DLC quickly delaminated, resulting in a wear pattern comparable with that of the uncoated sample. Based on the radius of curvature and the scar diameter (approximately 0.5 mm), a total volume loss of $6.6 \times 10^{-4}$ $mm^3$ was calculated. The degree of wear was substantially altered with the application of the silicon bonding gradient. While scarring was still evident, localized regions of higher film stress may have been generated by small gouges remaining on the polished surface of the pin, increasing the likelihood of delamination. While an estimate of the mass loss was difficult, a reduction in wear rate of at least 40% was suggested based on the size of the wear scar. No significant variation in the friction behavior was observed between coated and uncoated pins, either initially or at any time during the test, suggesting that the presence of the lubricant masks the tribological properties of DLC. Static and dynamic coefficients of friction were approximately 0.06 and 0.08 in each case. Reciprocating pin-on-flat tests performed on small test pieces under representative loading and temperature conditions showed a marked improvement in tribology for DLC-coated pins with a silicon bonding layer.

A similar reduction in wear rate and improvement in tribology can be expected for metal finishing surfaces made of high speed steel.

EXAMPLE 4

The procedures of Example 3 are repeated using germanium in place of silicon. Similar results are observed and similar results are predicted for metal finishing surfaces made of high speed steel.

Persons of ordinary skill in the art will recognize that many modifications may be made to the present invention without departing from the spirit and scope of the present invention. The embodiments described herein are meant to be illustrative only and should not be taken as limiting the invention, which is defined in the following claims.

We claim:

1. A tool comprising:
    a metal working surface comprising a base material selected from the group consisting of cobalt-cemented tungsten carbide and a metal alloy effective as a metal working surface, said metal working surface comprising the following sequential gradient:
    said base material;
    an intermetallic material comprising an element selected from the group consisting of silicon, germanium, and a combination thereof chemically bonded to metal in said base material, said metal consisting essentially of cobalt where said base material comprises cobalt-cemented tungsten carbide;
    an interlayer comprising said element selected from the group consisting of silicon, germanium, and a combination thereof cohesively bonded to said intermetallic material;
    carbon chemically bonded to said interlayer, forming a carbide selected from the group consisting of silicon carbide, germanium carbide, and a combination thereof; and,
    an outer layer consisting essentially of amorphous diamond-like carbon cohesively bonded to said carbide.

2. A cobalt-cemented tungsten carbide metal working tool having a metal working surface comprising the following sequential gradient:
    a base material comprising said cobalt-cemented tungsten carbide;
    an intermetallic material comprising an element selected from the group consisting of silicon, germanium, and a combination thereof chemically bonded to cobalt in said cobalt-cemented tungsten carbide;
    an interlayer comprising said element selected from the group consisting of silicon, germanium, and a combination thereof cohesively bonded to said intermetallic material;
    carbon chemically bonded to said interlayer, forming a carbide selected from the group consisting of silicon carbide, germanium carbide, and a combination thereof; and
    diamond-like carbon cohesively bonded to said carbide.

3. A metal working tool having a metal working surface comprising the following sequential gradient:
    a metal working surface comprising a base material comprising high speed steel;
    an intermetallic material comprising an element selected from the group consisting of silicon, germanium, and a combination thereof chemically bonded to metal in said base material;
    an interlayer comprising said element selected from the group consisting of silicon, germanium, and a combination thereof cohesively bonded to said intermetallic material;
    carbon chemically bonded to said interlayer, forming a carbide selected from the group consisting of silicon carbide, germanium carbide, and a combination thereof; and
    an outer layer consisting essentially of amorphous diamond-like carbon cohesively bonded to said carbide.

4. The tool of claim 1 wherein said metal alloy comprises a high speed steel.

5. The tool of claim 1 wherein said diamond-like carbon has a thickness of at least about 1 $\mu$m.

6. The tool of claim 2 wherein said diamond-like carbon has a thickness of at least about 1 $\mu$m.

7. The tool of claim 3 wherein said diamond-like carbon has a thickness of at least about 1 $\mu$m.

8. The tool of claim 4 wherein said diamond-like carbon has a thickness of at least about 1 $\mu$m.

9. The tool of claim 1 further comprising nitrogen bonded to carbon in said diamond-like carbon.

10. The tool of claim 2 further comprising nitrogen bonded to carbon in said diamond-like carbon.

11. The tool of claim 3 further comprising nitrogen bonded to carbon in said diamond-like carbon.

12. The tool of claim 4 further comprising nitrogen bonded to carbon in said diamond-like carbon.

13. The tool of claim 5 further comprising nitrogen bonded to carbon in said diamond-like carbon.

14. The tool of claim 6 further comprising nitrogen bonded to carbon in said diamond-like carbon.

15. The tool of claim 7 further comprising nitrogen bonded to carbon in said diamond-like carbon.

16. The tool of claim 8 further comprising nitrogen bonded to carbon in said diamond-like carbon.

* * * * *